(12) United States Patent
Curtis et al.

(10) Patent No.: US 12,203,790 B2
(45) Date of Patent: Jan. 21, 2025

(54) SYSTEMS AND METHODS FOR FLOW RATE DETECTION IN A LIQUID COOLING SYSTEM

(71) Applicant: Dell Products L.P., Round Rock, TX (US)

(72) Inventors: Robert B. Curtis, Georgetown, TX (US); Richard M. Eiland, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 245 days.

(21) Appl. No.: 17/859,766

(22) Filed: Jul. 7, 2022

(65) Prior Publication Data

US 2024/0011809 A1    Jan. 11, 2024

(51) Int. Cl.
| | | |
|---|---|---|
| *G01F 1/66* | (2022.01) | |
| *G01F 1/05* | (2006.01) | |
| *G01F 1/68* | (2006.01) | |
| *H05K 7/20* | (2006.01) | |

(52) U.S. Cl.
CPC ............... *G01F 1/666* (2013.01); *G01F 1/05* (2013.01); *G01F 1/68* (2013.01); *H05K 7/20272* (2013.01); *H05K 7/20818* (2013.01)

(58) Field of Classification Search
CPC .. G01F 1/666; G01F 1/68; G01F 1/05; H05K 7/20272; H05K 7/20818
USPC .......................................................... 73/127
See application file for complete search history.

(56) References Cited

U.S. PATENT DOCUMENTS

| | | | | |
|---|---|---|---|---|
| 4,315,300 A | * | 2/1982 | Parmerlee .......... | H05K 7/20636 361/698 |
| 4,498,118 A | * | 2/1985 | Bell .................... | H05K 7/20563 361/802 |
| 4,635,709 A | * | 1/1987 | Altoz ................. | H05K 7/20254 165/44 |

(Continued)

FOREIGN PATENT DOCUMENTS

| | | | | |
|---|---|---|---|---|
| CN | 109944806 A | * | 6/2019 | ............... F28D 1/04 |
| CN | 115877926 A | * | 3/2023 | ............... F28D 7/16 |

(Continued)

OTHER PUBLICATIONS

Yeom et al, Active heat sink with piezoelectric translational agitators, piezoelectric synthetic jets, and micro pin fin arrays, Experimental Thermal and Fluid Science 99 (2018) 190-199 (Year: 2018).*

(Continued)

*Primary Examiner* — Stephanie E Bloss
*Assistant Examiner* — Kevin C Butler
(74) *Attorney, Agent, or Firm* — Jackson Walker L.L.P.

(57) ABSTRACT

A system may include an information handling resource, a liquid cooling system for providing cooling of the information handling resource, a management controller for providing out-of-band management of the system, and a flow-rate sensor coupled to the liquid cooling system and configured to measure a volume of flow of fluid through a fluidic channel of the liquid cooling system per unit time and communicate one or more signals to the management controller indicative of the volume of the flow of the fluid through the fluidic channel of the liquid cooling system per unit time.

20 Claims, 6 Drawing Sheets

(56) References Cited

U.S. PATENT DOCUMENTS

| | | | | |
|---|---|---|---|---|
| 5,285,347 | A * | 2/1994 | Fox | G06F 1/20 |
| | | | | 257/714 |
| 6,483,707 | B1 * | 11/2002 | Freuler | H01L 23/3737 |
| | | | | 428/209 |
| 10,481,656 | B2 * | 11/2019 | Casparian | G06F 1/1632 |
| 11,592,880 | B2 * | 2/2023 | Shabbir | H05K 7/20209 |
| 11,836,023 | B2 * | 12/2023 | Chou | G05B 15/02 |
| 2006/0032616 | A1 * | 2/2006 | Yang | H01L 23/467 |
| | | | | 257/E23.099 |
| 2006/0139880 | A1 * | 6/2006 | Tate | G06F 1/20 |
| | | | | 257/E23.088 |
| 2007/0127214 | A1 * | 6/2007 | Chen | H01L 23/4093 |
| | | | | 361/709 |
| 2009/0177334 | A1 * | 7/2009 | Artman | G06F 1/206 |
| | | | | 713/340 |
| 2011/0122571 | A1 * | 5/2011 | Artman | G06F 1/206 |
| | | | | 361/679.48 |
| 2011/0176273 | A1 * | 7/2011 | Olsen | H05K 7/2039 |
| | | | | 361/679.49 |
| 2013/0016290 | A1 * | 1/2013 | Takahashi | H04N 5/64 |
| | | | | 348/836 |
| 2014/0218858 | A1 * | 8/2014 | Shelnutt | H05K 7/203 |
| | | | | 361/679.31 |
| 2014/0218859 | A1 * | 8/2014 | Shelnutt | H05K 7/20809 |
| | | | | 361/679.46 |
| 2014/0218861 | A1 * | 8/2014 | Shelnutt | H05K 7/20818 |
| | | | | 361/679.53 |
| 2015/0062806 | A1 * | 3/2015 | Shelnutt | H05K 7/20318 |
| | | | | 361/679.53 |
| 2015/0070846 | A1 * | 3/2015 | Shelnutt | H05K 7/20809 |
| | | | | 361/699 |
| 2017/0038804 | A1 * | 2/2017 | Shows | G06F 1/206 |
| 2017/0181322 | A1 * | 6/2017 | Shelnutt | H05K 7/1488 |
| 2017/0181323 | A1 * | 6/2017 | Shelnutt | H05K 7/20772 |
| 2017/0181324 | A1 * | 6/2017 | Shelnutt | H05K 7/20781 |
| 2017/0181326 | A1 * | 6/2017 | Shelnutt | H05K 7/20781 |
| 2017/0181327 | A1 * | 6/2017 | Shelnutt | H05K 7/20781 |
| 2017/0181328 | A1 * | 6/2017 | Shelnutt | G06F 1/20 |
| 2017/0181329 | A1 * | 6/2017 | Shelnutt | H05K 7/20781 |
| 2018/0192549 | A1 * | 7/2018 | Boegner | G05D 7/0623 |
| 2018/0235106 | A1 * | 8/2018 | Curtis | H05K 7/20145 |
| 2018/0341301 | A1 * | 11/2018 | Shabbir | G06F 1/206 |
| 2019/0323749 | A1 * | 10/2019 | Toulouse | H05K 7/20745 |
| 2020/0042052 | A1 * | 2/2020 | Shabbir | H05K 7/20809 |
| 2020/0166976 | A1 * | 5/2020 | Lin | G06F 1/1632 |
| 2020/0378858 | A1 * | 12/2020 | Curtis | F17D 5/06 |
| 2020/0401090 | A1 * | 12/2020 | North | F28D 15/02 |
| 2021/0373531 | A1 * | 12/2021 | Reddell | G06F 1/203 |
| 2022/0357722 | A1 * | 11/2022 | Kelly | G06F 11/3058 |
| 2023/0049625 | A1 * | 2/2023 | Carver | H05K 7/20136 |
| 2023/0092139 | A1 * | 3/2023 | Zhang | G06F 1/20 |
| | | | | 700/282 |
| 2023/0221781 | A1 * | 7/2023 | Carver | H05K 7/20145 |
| | | | | 361/127 |
| 2023/0413475 | A1 * | 12/2023 | Curtis | F16K 17/36 |
| 2023/0417602 | A1 * | 12/2023 | Curtis | H05K 7/20272 |
| 2024/0011809 | A1 * | 1/2024 | Curtis | G01F 1/075 |
| 2024/0023288 | A1 * | 1/2024 | Zuo | H05K 7/20272 |
| 2024/0027247 | A1 * | 1/2024 | Eiland | H05K 7/20836 |
| 2024/0032257 | A1 * | 1/2024 | Eiland | H05K 7/20609 |
| 2024/0049426 | A1 * | 2/2024 | Cheng | H05K 7/20272 |
| 2024/0098931 | A1 * | 3/2024 | Lovicott | H05K 7/20172 |

FOREIGN PATENT DOCUMENTS

| | | | | |
|---|---|---|---|---|
| EP | 91733 | A * | 10/1983 | H05K 7/20345 |
| EP | 3726339 | A1 * | 10/2020 | G06F 1/206 |

OTHER PUBLICATIONS

Sui et al., Design Analysis of Minichannel Heat Sink with Indented Fins under Impingement Flow Condition, 2017 18th International Conference on Electronic Packaging Technology, IEEE, May 7, 2023, p. 6 (Year: 2023).*

Bayomy et al., Electronic cooling using water flow in aluminum metal foam heat sink: Experimental and numerical approach, International Journal of Thermal Sciences 109 (2016) 182e200 (Year: 2016).*

Radmehr et al., A flow network analysis of a liquid cooling system that incorporates microchannel heat sinks, Innovative Research, Inc., Jan. 30, 2014, p. 9 (Year: 2014).*

Chen et al, Transient Heat Transfer Characteristics in a Flat Plate Heat Sink with Mini-Channels for Cooling High Heat Flux IGBT, Micromachines 2022, 13, 1417. https://doi.org/10.3390/mi13091417 (Year: 2022).*

Zelinka et al., AETA 2013: Recent Advances in Electrical Engineering and Related Sciences, Springer-Verlag, 2014, p. 125 (Year: 2014).*

Okamoto et al., Thermal Flow Sensor With a Bidirectional Thermal Reference, Journal of Microelectromechanical Systems, vol. 31, No. 5, Oct. 2022 (Year: 2022).*

* cited by examiner

SYSTEMS AND METHODS FOR FLOW RATE DETECTION IN A LIQUID COOLING SYSTEM

TECHNICAL FIELD

The present disclosure relates in general to information handling systems, and more particularly to measurement of liquid coolant flow rates in liquid-cooled information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

Existing liquid cooling cold plate assemblies and loops have no means for directly measuring the rate of flow of coolant fluid entering or exiting a liquid cooling system. If known, node-level fluid flow rates could be used to provide the user or system management controller with information about health status of the liquid system, including any issues with flow rate or leaks, or assist in balancing flow amongst a larger rack-level manifold/fluid system.

SUMMARY

In accordance with the teachings of the present disclosure, the disadvantages and problems associated with determining fluid flow rates in liquid cooling systems may be substantially reduced or eliminated.

In accordance with embodiments of the present disclosure, a system may include an information handling resource, a liquid cooling system for providing cooling of the information handling resource, a management controller for providing out-of-band management of the system, and a flow-rate sensor coupled to the liquid cooling system and configured to measure a volume of flow of fluid through a fluidic channel of the liquid cooling system per unit time and communicate one or more signals to the management controller indicative of the volume of the flow of the fluid through the fluidic channel of the liquid cooling system per unit time.

In accordance with these and other embodiments of the present disclosure, a method may include measuring a volume of flow of fluid, per unit time, through a fluidic channel of a liquid cooling system for providing cooling of an information handling resource, and communicating one or more signals to a management controller for providing out-of-band management of the system, the one or more signals indicative of the volume of the flow of the fluid through the fluidic channel of the liquid cooling system per unit time.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
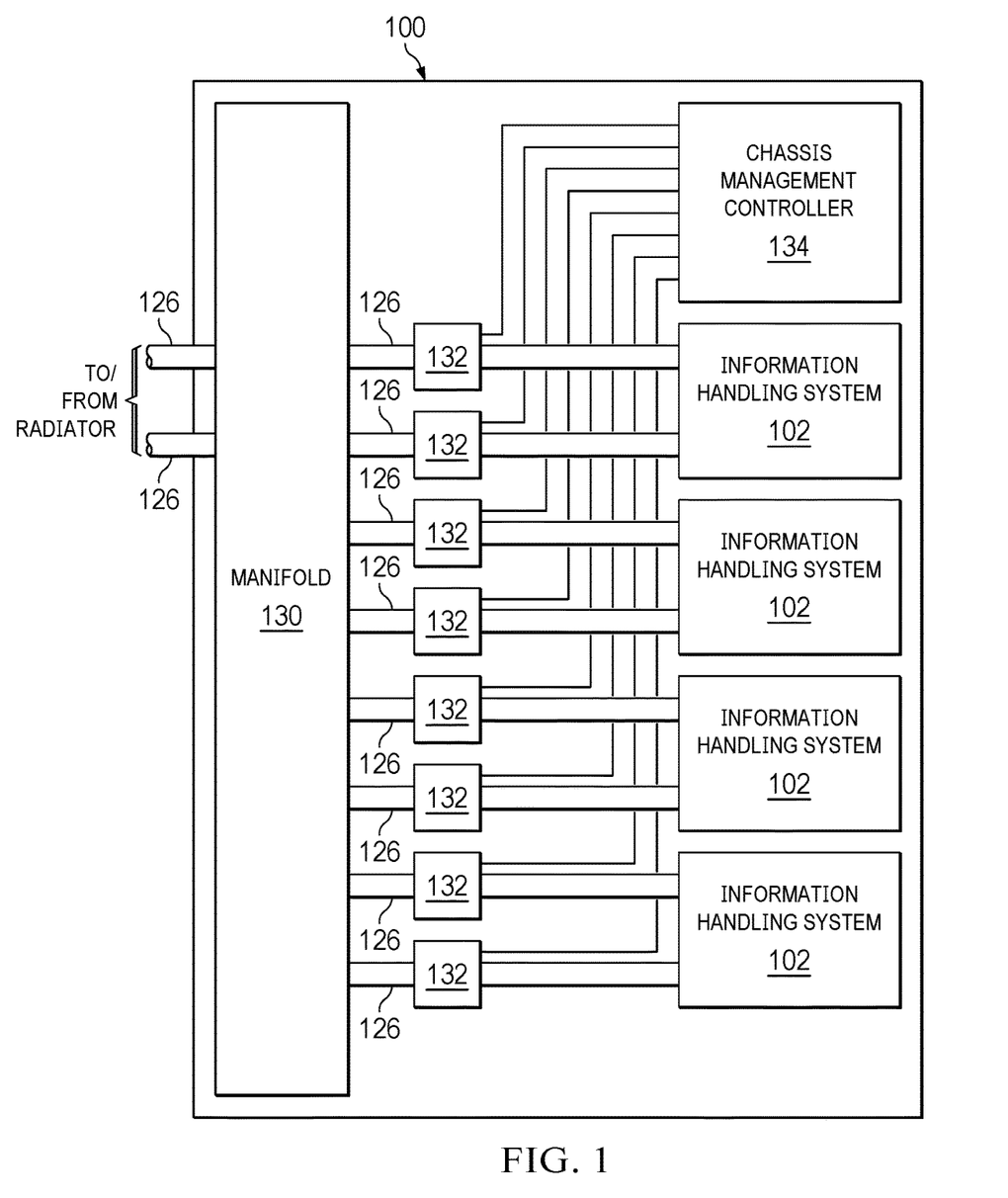
FIG. 1 illustrates a block diagram of selected components of an example server enclosure housing a plurality of information handling systems, in accordance with embodiments of the present disclosure.

FIG. 1 illustrates a block diagram of selected components of an example server enclosure 100 housing a plurality of information handling systems 102, in accordance with embodiments of the present disclosure. Enclosure 100 may comprise any suitable housing or other container for housing a plurality of information handling systems 102, and may be constructed from any suitable materials, including metal and/or plastic. As shown in FIG. 1, in addition to housing a plurality of information handling systems 102, enclosure 100 may also include a manifold 130, flow-rate sensors 132, a chassis management controller 134, and a plurality of fluidic conduits 126.

Manifold 130 may include any system, device, or apparatus configured to receive coolant fluid from a centralized fluid cooling and distribution system (e.g., a radiator for cooling coolant fluid), distribute (e.g., under pressure applied from a pump of the centralized fluid cooling and distribution system) such coolant fluid to the plurality of information handling systems 102 via fluidic conduits 126 fluidically coupled to manifold 130, receive such coolant fluid back from information handling systems 102 via fluidic conduits 126 fluidically coupled to manifold 130, and then distribute coolant fluid back to the centralized fluid cooling and distribution system.

Thus, in operation, manifold 130 may receive cooled coolant fluid from the centralized fluid cooling and distribution system (e.g., a radiator) and convey the coolant fluid to each of information handling systems 102. Each information handling system 102 may have its own internal coolant fluid distribution network, such that coolant fluid distributed to each information handling system 102 may cool components of such information handling system 102 on account of heat transfer from such components to the coolant fluid. After flowing through the internal coolant fluid distribution network of an information handling system 102, the heated coolant fluid may return to manifold 130. Manifold 130 may be constructed to isolate the cooled coolant fluid received from the centralized fluid cooling and distribution system from the heated coolant fluid received from information handling systems 102. Manifold 130 may further route the heated coolant fluid back to the centralized fluid cooling and distribution system, where the coolant fluid may be cooled and recirculated back to manifold 130.

As also shown, a plurality of flow-rate sensors 132 may be fluidically coupled between manifold 130 and respective information handling systems 102. A flow-rate sensor 132 may comprise any suitable system, device, or apparatus configured to measure a physical quantity indicative of volume of coolant fluid flowing through such flow-rate sensor 132 per unit time, and further configured to communicate an electrical or electronic signal (e.g., to chassis management controller 134) indicative of such volume of coolant fluid flowing through such flow-rate sensor 132 per unit time. In some embodiments, a flow-rate sensor 132 may also be configured to measure a temperature of fluid flowing through flow-rate sensor 132 and communicate an electrical or electronic signal (e.g., to chassis management controller 134) indicative of temperature.

Although flow-rate sensors 132 are shown in FIG. 1 as being coupled to both the fluid inlets of information handling systems 102 and the fluid outlets of information handling systems 102, in some embodiments, flow-rate sensors 132 may be present only at fluid inlets of information handling systems 102 or only at fluid outlets of information handling systems 102.

Chassis management controller 134 may comprise any system, device, or apparatus configured to facilitate management and/or control of chassis 100 and/or one or more of its component information handling systems 102. Chassis management controller 134 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Chassis management controller 134 also may be configured to provide out-of-band management facilities for management of chassis 100, for example via a management console communicatively coupled to chassis management controller 134. Such management may be made by chassis management controller 134 even if chassis 100 and its information handling systems 102 are powered off or powered to a standby state.

In operation, flow-rate sensors 132 may each measure respective flow rates of coolant fluid flowing through them and report signals indicative of the respective flow rates to chassis management controller 134. In some embodiments, chassis management controller 134 may intelligently analyze the respective flow rates in order to determine a health status of the liquid cooling system including any issues with flow rate, leaks, and/or flow imbalances. In other embodiments, chassis management controller 134 may simply collect information regarding the respective flow rates for analysis by an administrator or user interfacing (e.g., with a management console) via chassis management controller 134.

Figure 2:
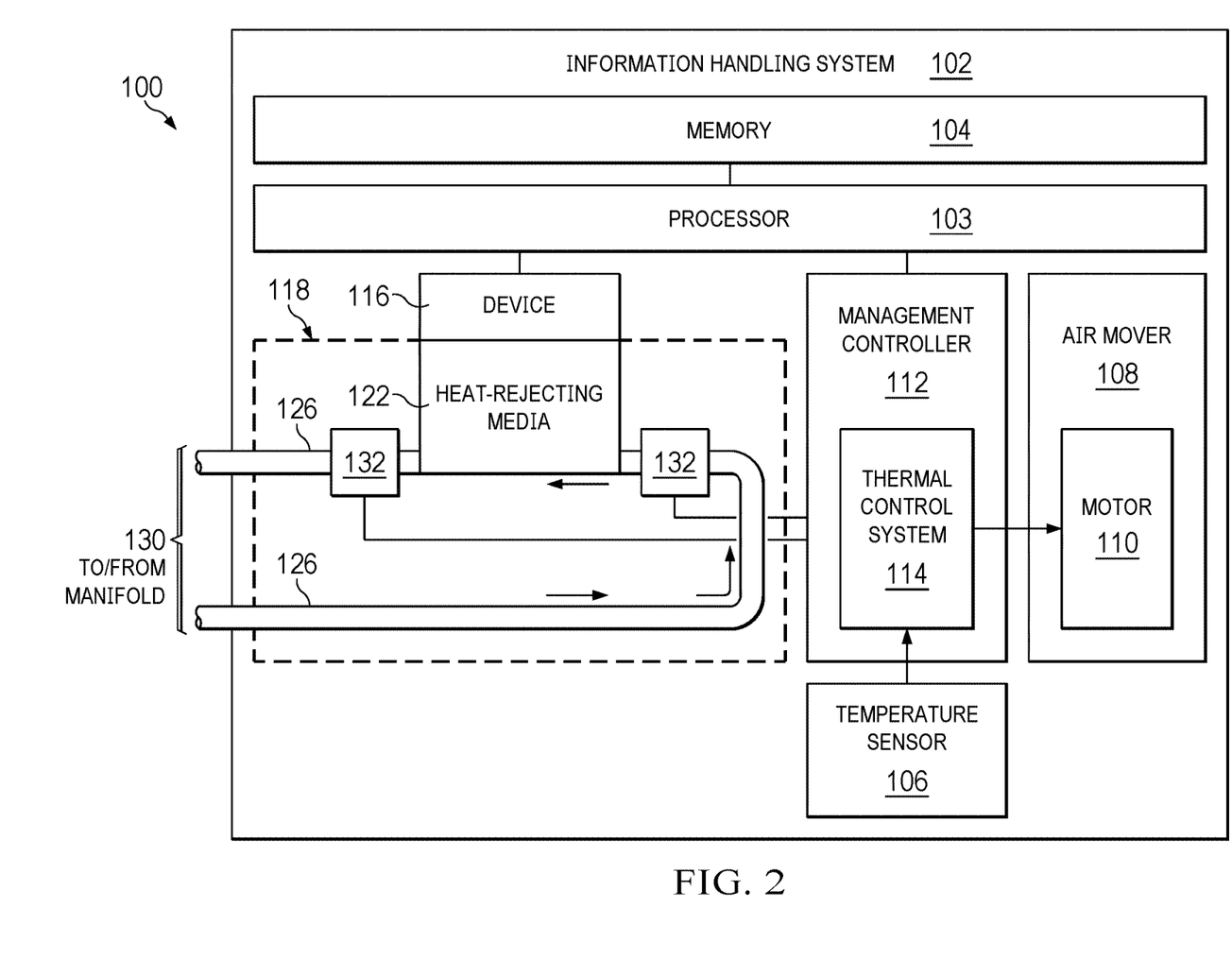
FIG. 2 illustrates a block diagram of selected components of an example information handling system, in accordance with embodiments of the present disclosure.

FIG. 2 illustrates a block diagram of selected components of an example information handling system 102, in accordance with embodiments of the present disclosure. In some embodiments, information handling system 102 may comprise a server or "blade." In other embodiments, information handling system 102 may comprise a personal computer (e.g., a desktop computer, laptop computer, mobile computer, and/or notebook computer). In yet other embodiments, information handling system 102 may comprise a storage device configured to house a plurality of physical disk drives and/or other computer-readable media for storing data. As shown in FIG. 2, information handling system 102 may include a processor 103, a memory 104, a temperature sensor 106, an air mover 108, a management controller 112, a device 116, and a liquid cooling system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal communicated from thermal control system 114 of management controller 112. In operation, air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102, for example via a management console communicatively coupled to management controller 112. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller.

As shown in FIG. 2, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirement information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies.

Oftentimes, an architecture of information handling system 102 may be such that device 116 may not be adequately cooled by air mover 108, and thus liquid cooling system 118 may provide cooling of device 116 in addition to or in lieu of air mover 108. As shown in FIG. 2, liquid cooling system 118 may include heat-rejecting media 122, one or more flow-rate sensors 132, and fluidic conduits 126.

In normal operation, a pump (which is not explicitly shown and may be external to information handling system 102 and may be located within a centralized fluid cooling and distribution system) may induce a flow of liquid (e.g., water, ethylene glycol, propylene glycol, or other coolant) through various fluidic conduits 126 of information handling system 102 and flow-rate sensors 132. As fluid passes by heat-rejecting media 122 in a fluidic conduit 126 proximate to device 116, heat may be transferred from device 116 to heat-rejecting media 122 and from heat-rejecting media 122 to the liquid coolant in fluidic conduit 126. Such heated coolant may flow to a radiator (which is not explicitly shown and may be external to information handling system 102 and may be located within a centralized fluid cooling and distribution system), and heat from the coolant may be transferred from the coolant to air ambient to such radiator, thus cooling the fluid.

Heat-rejecting media 122 may include any system, device, or apparatus configured to transfer heat from an information handling resource (e.g., device 116, as shown in FIG. 2), thus reducing a temperature of the information handling resource. For example, heat-rejecting media 122 may include a solid thermally coupled to the information handling resource (e.g., heat pipe, heat spreader, heatsink, finstack, etc.) such that heat generated by the information handling resource is transferred from the information handling resource.

As also shown in FIG. 2, a plurality of flow-rate sensors 132 (which may be the same or similar to flow-rate sensors 132 depicted in FIG. 1) may be fluidically coupled within the coolant fluid path of liquid cooling system 118. As shown in FIG. 2, a flow-rate sensor 132 may be configured to communicate an electrical or electronic signal (e.g., to management controller 112), indicative of a volume of coolant fluid flowing through such flow-rate sensor 132 per unit time. In some embodiments, a flow-rate sensor 132 may also be configured to measure a temperature of fluid flowing through flow-rate sensor 132 and communicate an electrical or electronic signal (e.g., to management controller 112) indicative of temperature.

Although flow-rate sensors 132 are shown in FIG. 2 as being coupled to both the fluid inlet of heat-rejecting media 122 and the fluid outlet of heat-rejecting media 122, in some embodiments, flow-rate sensors 132 may be present only at fluid inlets of heat-rejecting media 122 or only at fluid outlets of heat-rejecting media 122. Further, although (for purposes of clarity and exposition) only one instance of heat-rejecting media 122 is shown in FIG. 2, in some embodiments, liquid cooling system 118 may have multiple instances of heat-rejecting media 122, which may be fluidically coupled in parallel and/or series with each other.

In operation, flow-rate sensors 132 may each measure respective flow rates of coolant fluid flowing through them and report signals indicative of the respective flow rates to management controller 112. As mentioned above, in some embodiments, flow-rate sensors 132 may also report signals indicative of a temperature of fluid flowing through the flow-rate sensors 132. In some embodiments, chassis management controller 112 may intelligently analyze the respective flow rates in order to determine a health status of the liquid cooling system including any issues with flow rate, leaks, flow imbalances, and/or fluid temperature. In other embodiments, chassis management controller 112 may simply collect information regarding the respective flow rates for analysis by an administrator or user interfacing (e.g., with a management console) via chassis management controller 112.

In yet other embodiments, management controller 112 may be communicatively coupled to chassis management controller 134, enabling the collection and/or analysis of flow-rate sensor data at one centralized device.

In addition to processor 103, memory 104, temperature sensor 106, air mover 108, management controller 112, device 116, and liquid cooling system 118, information handling system 102 may include one or more other information handling resources. In addition, for the sake of clarity and exposition of the present disclosure, FIG. 1 depicts only one air mover 108 and one device 116. In embodiments of the present disclosure, information handling system 102 may include any number of air movers 108 and devices 116. Furthermore, for the sake of clarity and exposition of the present disclosure, FIG. 2 depicts device 116 including a liquid cooling system 118 for cooling of device 116. However, in some embodiments, approaches similar or identical to those used to actively cool device 116 as described herein may be employed to provide active cooling of processor 103, memory 104, management controller 112, and/or any other information handling resource of information handling system 102.

Figure 3:
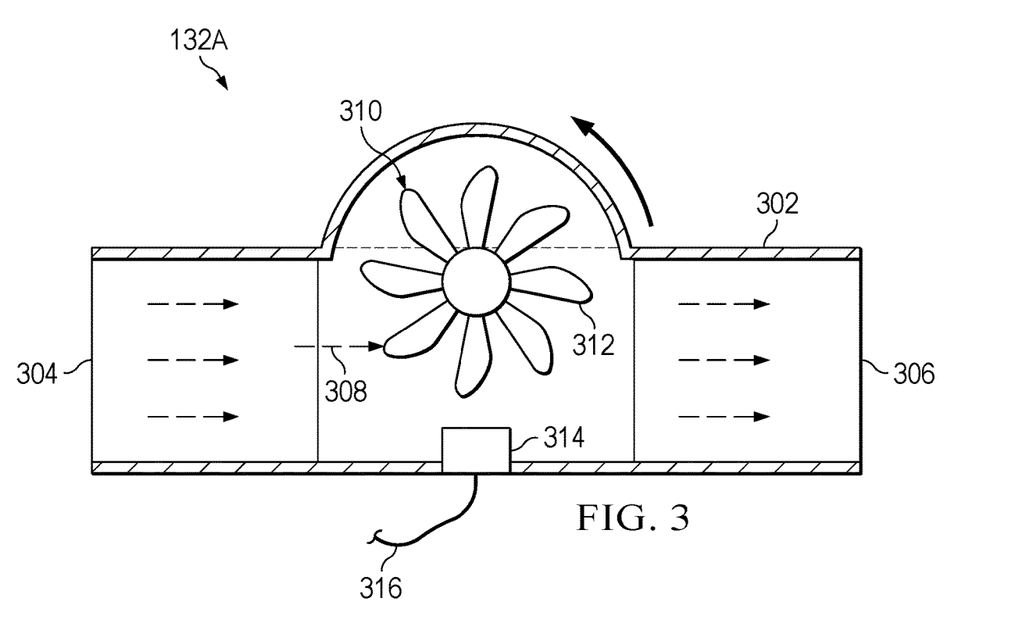
FIG. 3 illustrates a side elevation view of an example flow-rate sensor, in accordance with embodiments of the present disclosure.

FIG. 3 illustrates a side elevation view of an example flow-rate sensor 132A, in accordance with embodiments of the present disclosure. Flow-rate sensor 132A may be used to implement one or more of flow-rate sensors 132 depicted in FIGS. 1 and 2. As shown in FIG. 3, flow-rate sensor 132A may include a body 302 that forms a fluid inlet 304 for receiving a flow of fluid and a fluid outlet 306 for expelling the flow of fluid. The flow of fluid from fluid inlet 304 to fluid outlet 306 may create a single jet 308 of fluid flow that may cause rotation of an impeller 310 rotationally coupled to body 302. As shown in FIG. 3, impeller 310 may include a plurality of fins 312 that may cause rotation of impeller 310 relative to body 302 in the presence of a flow of fluid from fluid inlet 304 to fluid outlet 306. In some embodiments, one or more of fins 312 may be formed at least in part with ferromagnetic material (e.g., having a magnetic tip).

As shown in FIG. 3, flow-rate sensor 132A may also include a magnetic sensor 314 (a Hall sensor or other magnetic sensor) mechanically coupled to body 302 at a fixed position. Magnetic sensor 314 may include any suitable system, device, or apparatus configured to detect the presence of a magnetic field proximate to magnetic sensor 314, and generate an electrical or electronic signal indicative of such proximity. Accordingly, if impeller 310 includes one or more fins 312 formed at least in part with magnetic material, then each time one of such fins 312 is proximate to magnetic sensor 314, magnetic sensor 314 may detect such proximity, indicating an amount of rotation of impeller 310 relative to body 302. Accordingly, magnetic sensor 314 may determine a rotational speed of impeller 310 (e.g., in rotations per minute or other measure of rotational speed), wherein such rotational speed is proportional to a flow rate of fluid from fluid inlet 304 to fluid outlet 306.

As further shown in FIG. 3, a cable 316 may be communicatively coupled to magnetic sensor 314 for communication of an electrical or electronic signal from magnetic sensor 314 (e.g., to chassis management controller 134 or management controller 112) indicative of the flow rate of fluid from fluid inlet 304 to fluid outlet 306. In some embodiments, such cable 316 may also be capable of communicating an electrical or electronic signal indicative of temperature. In some embodiments, cable 316 may be terminated with a connector configured electrically and mechanically to a corresponding connector. In other embodiments, cable 316 may be unterminated and configured to directly couple to another circuit (e.g., to chassis management controller 134 or management controller 112).

For purposes of clarity and exposition, the foregoing contemplates flow of liquid only in a single direction from fluid inlet 304 to fluid outlet 306. However, in some embodiments, flow-rate sensor 132A may be capable of handling flow of fluid from fluid outlet 306 to fluid inlet 304 in addition to or in lieu of flow of fluid from fluid inlet 304 to fluid outlet 306.

Figure 4:
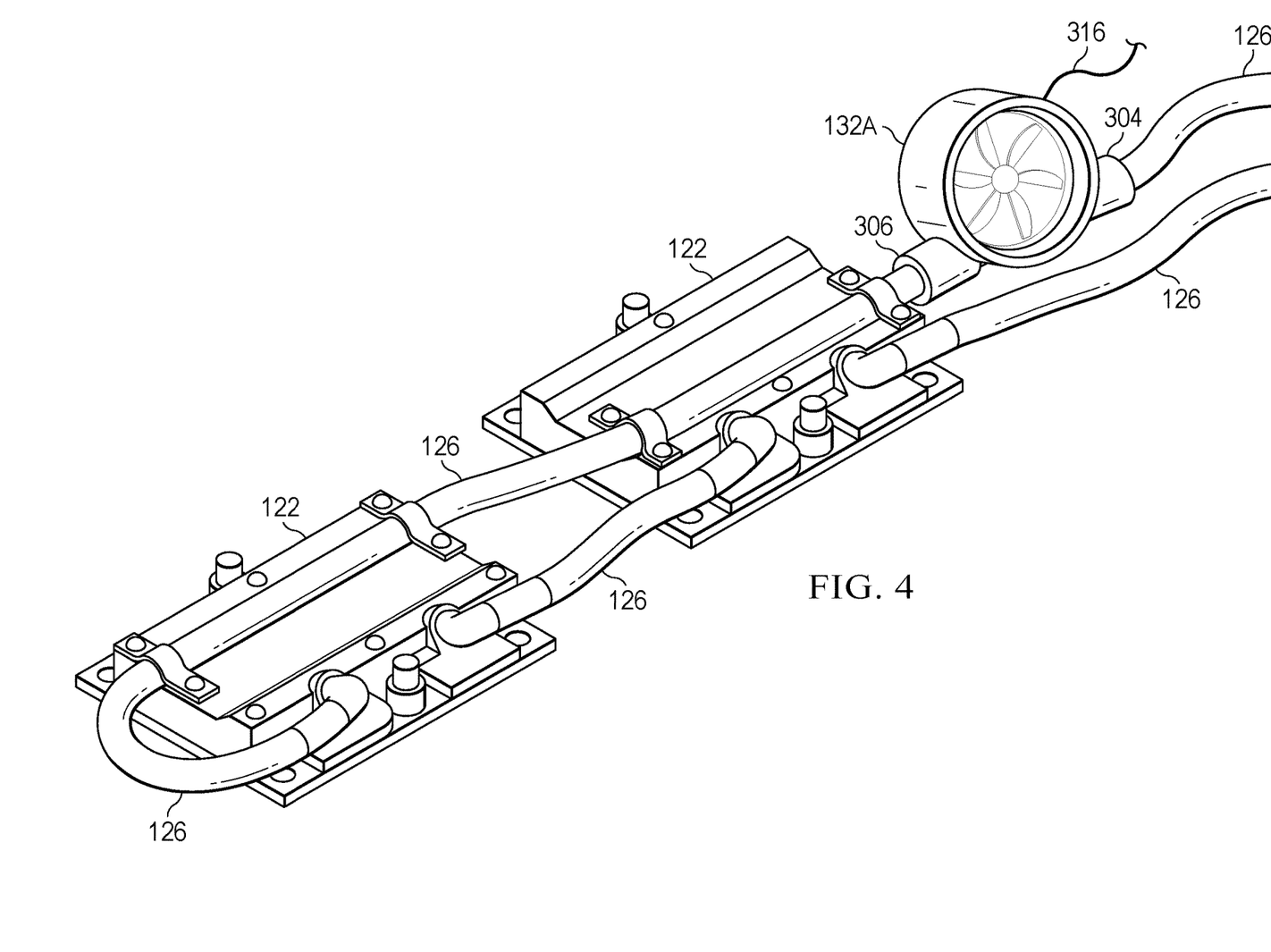
FIG. 4 illustrates an isometric perspective view of an example flow rate sensor coupled between heat-rejecting media and a fluidic conduit, in accordance with embodiments of the present disclosure.

FIG. 4 illustrates an isometric perspective view of an example flow rate sensor 132A coupled between heat-rejecting media 122 and a fluidic conduit 126, as may occur in a liquid cooling system 118 of an information handling system 102, in accordance with embodiments of the present disclosure.

Figure 5:
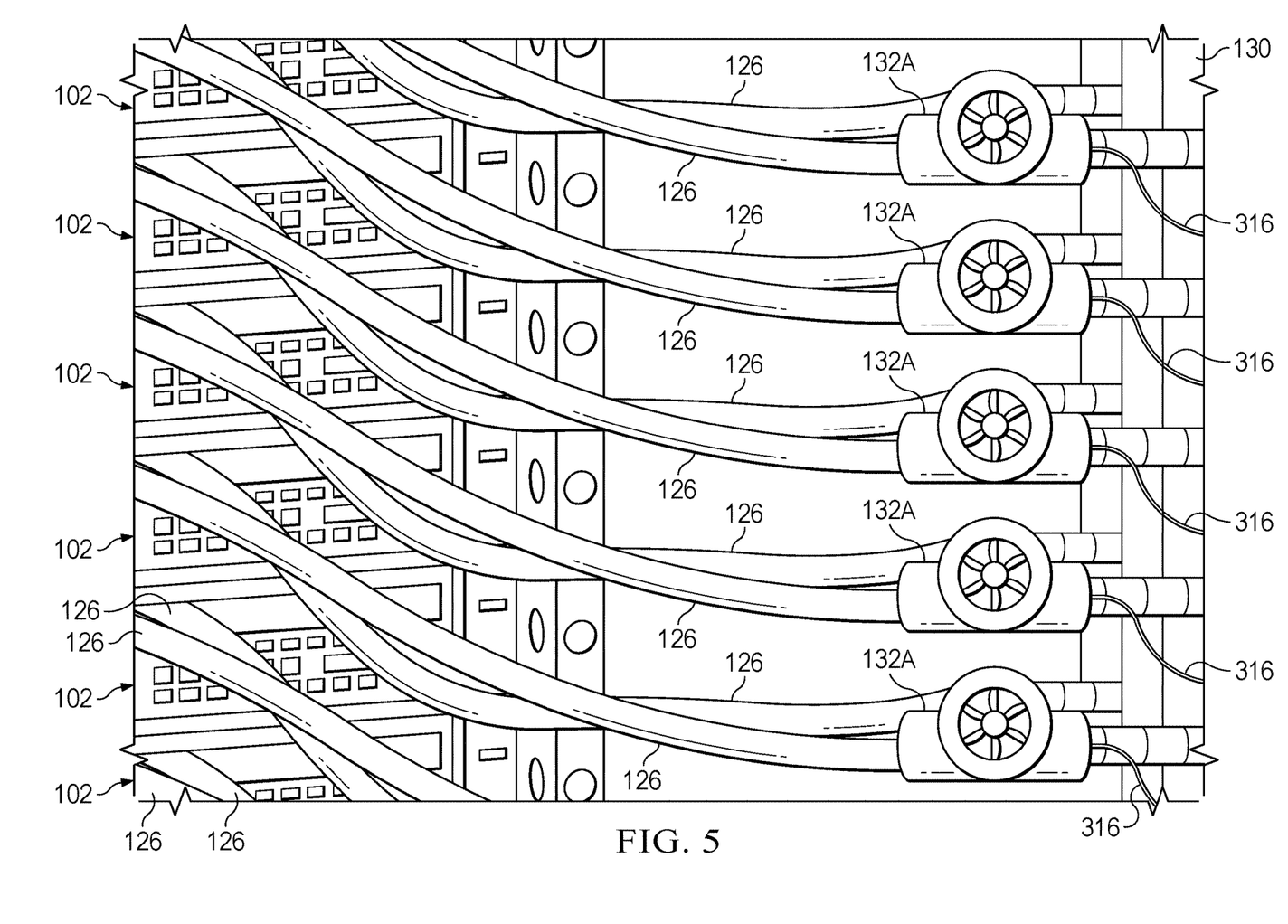
FIG. 5 illustrates an isometric perspective view of an example flow rate sensor coupled between a manifold and a fluidic conduit, as may occur in a chassis, in accordance with embodiments of the present disclosure.

FIG. 5 illustrates an isometric perspective view of an example flow-rate sensor 132A coupled between manifold 130 and a fluidic conduit 126, as may occur in chassis 100, in accordance with embodiments of the present disclosure.

Figure 6:
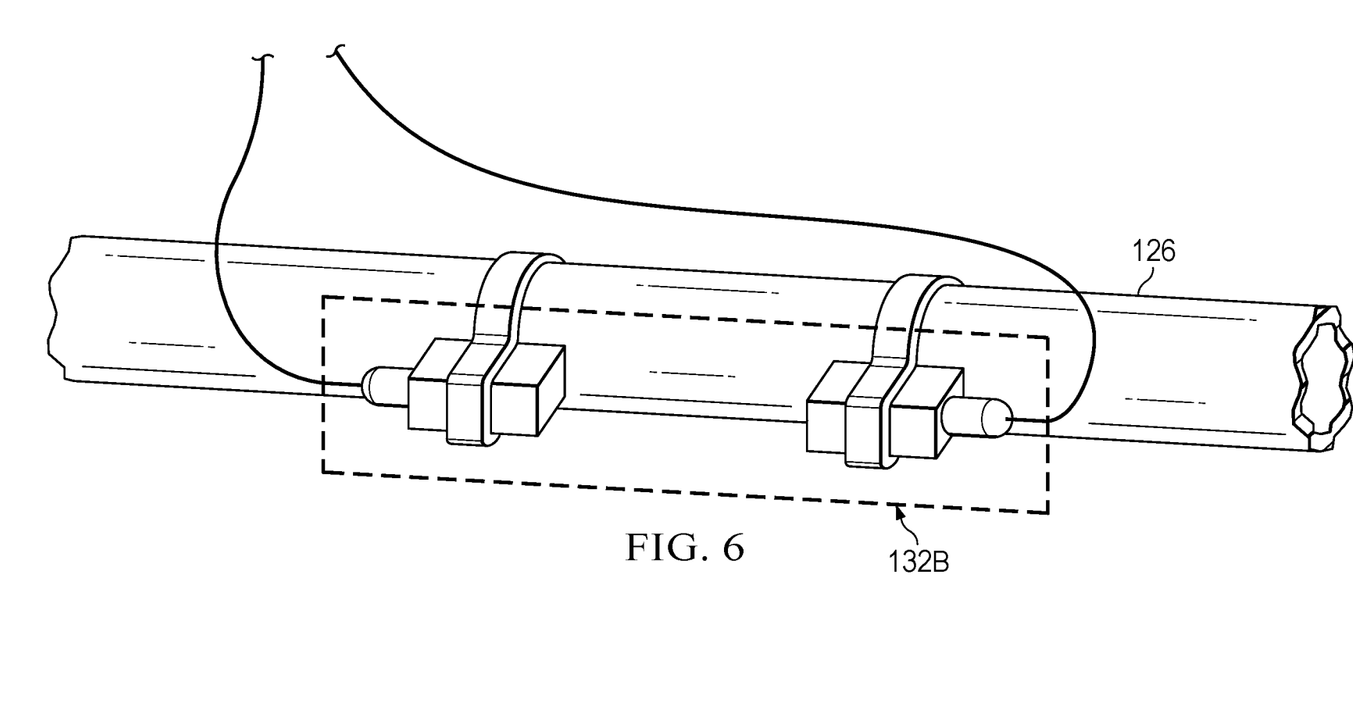
FIG. 6 illustrates a side elevation view of another example flow-rate sensor coupled to a fluidic conduit, in accordance with embodiments of the present disclosure.

Although the foregoing contemplates use of a mechanical-based flow-rate sensor 132A fluidically coupled inline with fluidic channels such that fluid flow causes mechanical motion of a sensor component, it is understood that one or more of flow-rate sensors 132 depicted in FIGS. 1 and 2 may be implemented in any other suitable manner. For example, FIG. 6 illustrates a side elevation view of another example ultrasonic flow-rate sensor 132B acoustically coupled to a fluidic conduit 126, in accordance with embodiments of the present disclosure. Ultrasonic flow-rate sensor 132B may be used to implement one or more of flow-rate sensors 132 depicted in FIGS. 1 and 2. Ultrasonic flow-rate sensor 132B may comprise any system, device, or apparatus configured to, based on ultrasonic acoustic waves caused by flow of fluid through fluidic conduit 126, generate one or more signals (e.g., via cables 316) indicative of a volume of flow of fluid through fluidic conduit per unit time.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   an information handling resource;
   a liquid cooling system for providing cooling of the information handling resource;
   a management controller for providing out-of-band management of the system; and
   a flow-rate sensor coupled to the liquid cooling system between an information handling system and a manifold of a chassis configured to house a plurality of information handling systems including the information handling system, wherein the flow-rate sensor is configured to:
      measure a volume of flow of fluid through a fluidic channel of the liquid cooling system per unit time; and
      communicate one or more signals to the management controller indicative of the volume of the flow of the fluid through the fluidic channel of the liquid cooling system per unit time.

2. The system of claim 1, wherein the management controller is a chassis management controller configured to provide out-of-band management of the chassis and components housed within the chassis.

3. The system of claim 1, wherein the flow-rate sensor is internal to an information handling system.

4. The system of claim 3, wherein the flow-rate sensor is coupled to heat-rejecting media and configured to communicate the one or more signals to the management controller indicative of the volume of the flow of the fluid through the heat-rejecting media per unit time.

5. The system of claim 3, wherein the management controller is configured to provide out-of-band management of the information handling system and components of the information handling system.

6. The system of claim 1, wherein the flow-rate sensor comprises:
a body having a fluid inlet and a fluid outlet, each of the fluid inlet and the fluid outlet fluidically coupled to the liquid cooling system;
an impeller rotationally coupled to the body and configured to rotate relative to the body in response to flow of fluid from the fluid inlet and the fluid outlet; and
a rotational sensor configured to determine a rotational speed of the impeller relative to the body.

7. The system of claim 6, wherein the rotational sensor comprises a magnetic sensor.

8. The system of claim 1, wherein the flow-rate sensor comprises an ultrasonic sensor acoustically coupled to a fluidic conduit of the liquid cooling system and configured to, based on ultrasonic acoustic waves caused by flow of fluid through the fluidic conduit, communicate the one or more signals to the management controller indicative of the volume of the flow of the fluid through the fluidic conduit per unit time.

9. The system of claim 1, wherein the flow-rate sensor is further configured to:
measure a temperature of the fluid flowing through the flow-rate sensor; and
communicate one or more signals to the management controller indicative of the temperature.

10. A method comprising:
coupling a flow-rate sensor to a liquid cooling system between an information handling system and a manifold of a chassis configured to house a plurality of information handling systems including the information handling system;
measuring a volume of flow of fluid, per unit time, through a fluidic channel of the liquid cooling system for providing cooling of an information handling resource; and
communicating one or more signals to a management controller for providing out-of-band management of the system, the one or more signals indicative of the volume of the flow of the fluid through the fluidic channel of the liquid cooling system per unit time.

11. The method of claim 10, wherein the management controller is a chassis management controller configured to provide out-of-band management of the chassis and components housed within the chassis.

12. The method of claim 10, further comprising locating the flow-rate sensor internal to an information handling system.

13. The method of claim 12, further comprising coupling the flow-rate sensor to heat-rejecting media and communicating the one or more signals to the management controller indicative of the volume of the flow of the fluid through the heat-rejecting media per unit time.

14. The method of claim 12, wherein the management controller is configured to provide out-of-band management of the information handling system and components of the information handling system.

15. The method of claim 10, wherein the flow-rate sensor comprises:
a body having a fluid inlet and a fluid outlet, each of the fluid inlet and the fluid outlet fluidically coupled to the liquid cooling system;
an impeller rotationally coupled to the body and configured to rotate relative to the body in response to flow of fluid from the fluid inlet and the fluid outlet; and
a rotational sensor configured to determine a rotational speed of the impeller relative to the body.

16. The method of claim 15, wherein the rotational sensor comprises a magnetic sensor.

17. The method of claim 10, wherein the flow-rate sensor comprises an ultrasonic sensor and the method further comprises acoustically coupling the ultrasonic sensor to a fluidic conduit of the liquid cooling system such that the ultrasonic sensor is configured to, based on ultrasonic acoustic waves caused by flow of fluid through the fluidic conduit, communicate the one or more signals to the management controller indicative of the volume of the flow of the fluid through the fluidic conduit per unit time.

18. The method of claim 10, further comprising:
measuring temperature of the fluid flowing through the fluidic channel; and
communicating one or more signals to a management controller for providing out-of-band management of the system, the one or more signals indicative of the temperature.

19. A system comprising:
an information handling resource;
a liquid cooling system for providing cooling of the information handling resource;
a management controller for providing out-of-band management of the system; and
a flow-rate sensor coupled to the liquid cooling system and configured to:
measure a volume of flow of fluid through a fluidic channel of the liquid cooling system per unit time; and
communicate one or more signals to the management controller indicative of the volume of the flow of the fluid through the fluidic channel of the liquid cooling system per unit time;
wherein the flow-rate sensor comprises:
a body having a fluid inlet and a fluid outlet, each of the fluid inlet and the fluid outlet fluidically coupled to the liquid cooling system;
an impeller rotationally coupled to the body and configured to rotate relative to the body in response to flow of fluid from the fluid inlet and the fluid outlet; and
a rotational sensor configured to determine a rotational speed of the impeller relative to the body.

20. A method comprising:
measuring a volume of flow of fluid, per unit time, through a fluidic channel of a liquid cooling system for providing cooling of an information handling resource, via a flow-rate sensor, wherein the flow-rate sensor comprises:
a body having a fluid inlet and a fluid outlet, each of the fluid inlet and the fluid outlet fluidically coupled to the liquid cooling system;

an impeller rotationally coupled to the body and configured to rotate relative to the body in response to flow of fluid from the fluid inlet and the fluid outlet; and a rotational sensor configured to determine a rotational speed of the impeller relative to the body; and communicating one or more signals to a management controller for providing out-of-band management of the system, the one or more signals indicative of the volume of the flow of the fluid through the fluidic channel of the liquid cooling system per unit time.

\* \* \* \* \*